United States Patent [19]

Chandrasekhar

[11] Patent Number: 4,598,462
[45] Date of Patent: Jul. 8, 1986

[54] METHOD FOR MAKING SEMICONDUCTOR DEVICE WITH INTEGRAL FUSE

[75] Inventor: Hosekere S. Chandrasekhar, Whitehouse Station, N.J.

[73] Assignee: RCA Corporation, Princeton, N.J.

[21] Appl. No.: 715,039

[22] Filed: Mar. 22, 1985

Related U.S. Application Data

[62] Division of Ser. No. 482,856, Apr. 7, 1983, abandoned.

[51] Int. Cl.⁴ ......................................... H01L 21/225
[52] U.S. Cl. ........................... 29/577 C; 29/576 B; 29/591; 148/1.5; 148/DIG. 55; 357/51
[58] Field of Search ............. 29/577 C, 576 B, 591; 148/1.5, DIG. 55; 357/49, 51, 55

[56] References Cited

U.S. PATENT DOCUMENTS

| | | | |
|---|---|---|---|
| 3,391,023 | 7/1968 | Frescura | 117/212 |
| 3,564,354 | 2/1971 | Aoki et al. | 317/235 |
| 3,619,725 | 11/1971 | Soden et al. | 357/51 |
| 3,699,395 | 10/1972 | Boleky | 317/101 |
| 3,699,403 | 10/1972 | Boleky, III | 317/235 |
| 3,852,802 | 12/1974 | Wolf et al. | 357/27 |
| 3,865,649 | 2/1975 | Beasom | 148/187 |
| 3,895,392 | 7/1975 | Polata et al. | 357/44 |
| 4,042,950 | 8/1977 | Price | 357/51 |
| 4,299,024 | 11/1981 | Piotrowski | 29/577 |
| 4,553,318 | 11/1985 | Chandrasekhar | 29/591 |

FOREIGN PATENT DOCUMENTS 105988 8/1979 Japan ............................. 357/51

OTHER PUBLICATIONS

Isolation Techniques for Very Large Scale Integration, D. Beernaert, G. Schols, P. Van Iseghem, The Technical Journal.

Primary Examiner—Aaron Weisstuch
Assistant Examiner—J. Callahan
Attorney, Agent, or Firm—Birgit E. Morris; Donald S. Cohen; James M. Trygg

[57] ABSTRACT

A semiconductor device and method for making same having dielectrically isolated individual elements such as transistors, diodes, et al. Some of the isolated elements having fuses formed integral thereto.

7 Claims, 17 Drawing Figures

METHOD FOR MAKING SEMICONDUCTOR DEVICE WITH INTEGRAL FUSE

The Government has rights in this invention pursuant to Subcontract No. A2ZV-522627-F-507 under Contract No. F04704-78-C-0021 awarded by the Department of the Air Force.

This is a division of application Ser. No. 482,856, filed Apr. 7, 1983, now abandoned.

The present invention relates to dielectrically isolated fusible devices and more particularly to such devices having the fuse element integrated into the device structure, and method of making same.

Semiconductor devices having dielectrically isolated well regions heretofore have been formed independent of the formation of fuse elements that may be associated therewith. That is, the fuse element has not been formed integral to the well region, but rather, has been arranged external thereto. Frequently, a portion of a conductor which interconnects two or more well regions on the same semiconductor device is utilized as the fuse element. In such cases the portion of the conductor that is to be the fuse is formed with a cross section that is considerably smaller than that of the rest of the conductor. When sufficient current is passed through the conductor, the portion having the reduced cross section will fuse and thereby open the circuit. See, for example U.S. Pat. No. 3,564,354, issued Feb. 16, 1971 to Aoki et al and U.S. Pat. No. 3,699,395 issued Oct. 17, 1972 to Boleky, both of which disclose such structures.

SUMMARY OF THE INVENTION

According to the present invention a semiconductor device is disclosed having a substrate and a plurality of spaced apart well or conductive regions formed therein. An insulating means is provided for dielectrically isolating the conductive regions from each other and from the substrate. A fuse element comprising platinum silicide is associated with and formed integral to at least one of the conductive regions.

DESCRIPTION OF THE PREFERRED EMBODIMENT

Figure 1:
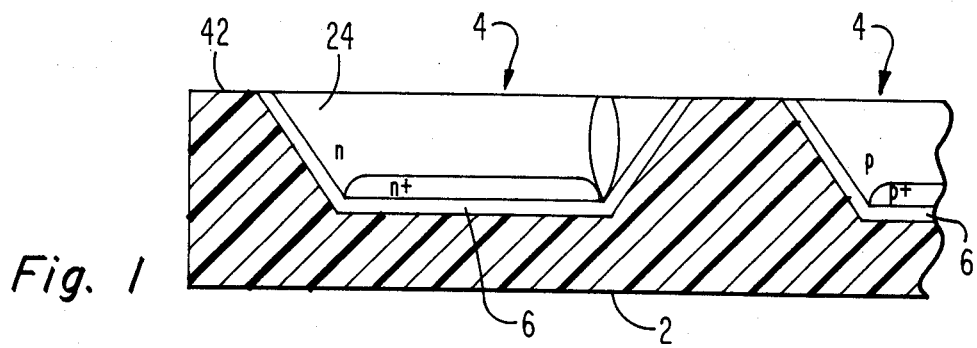
FIGS. 1 through 12, 12a and 13 through 16 are schematic representations of cross sectional views of a portion of a semiconductor device showing various steps of manufacture utilizing the teachings of this invention.

The device shown in FIG. 1 has a plurality of dielectrically isolated well or conductivity regions, some of which are of n-type conductivity material and others are of p-type conductivity material. Such wafers are well known in the art as are the methods for making them. For more detailed information on the structure and methods of manufacture of such devices, the reader is referred to U.S. Pat. No. 3,852,802, issued on Dec. 3, 1974 to Wolf et al and U.S. Pat. No. 3,954,522, issued on May 4, 1976 to Robinson. For purposes of this disclosure the device shown in FIG. 1 is presumed to be easily obtainable by one skilled in the art and therefore will represent the starting point in describing the semiconductor device of the present invention and the method for making same.

Referring to FIGS. 1 through 16 there is shown a portion of an integrated circuit in cross section including a substrate and a plurality of spaced apart well or conductivity regions 4. Each of the well regions 4 are dielectrically isolated from the substrate 2 by a layer of silicon oxide 6 or some other suitable dielectric material. The well regions 4 form individual elements such as transistors, diodes, memory devices, or the like and are composed of various semiconducting materials suitable for the specific element desired.

Figure 12:
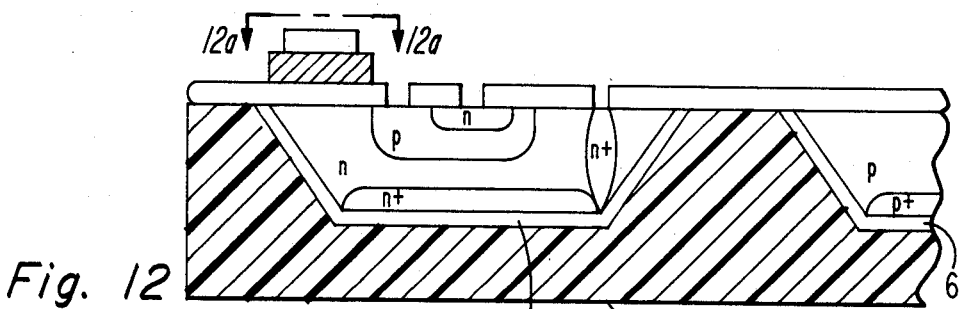
Figure 12A:
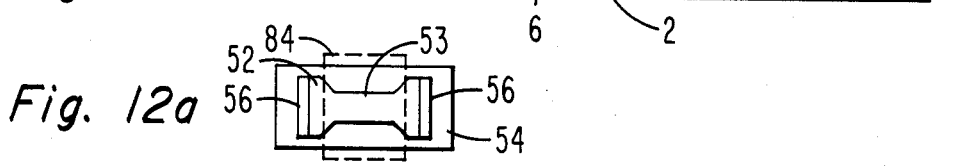
Figure 13:
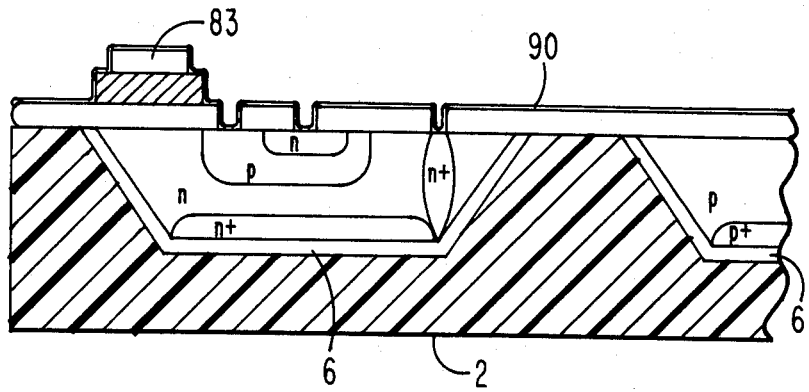
Figure 14:
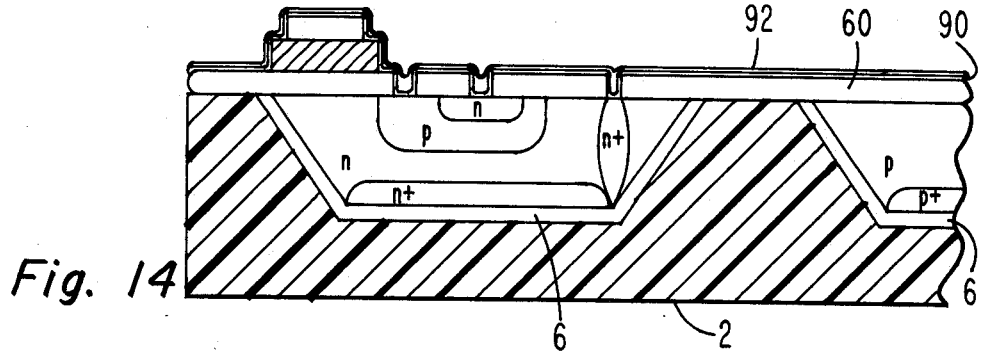
Figure 15:
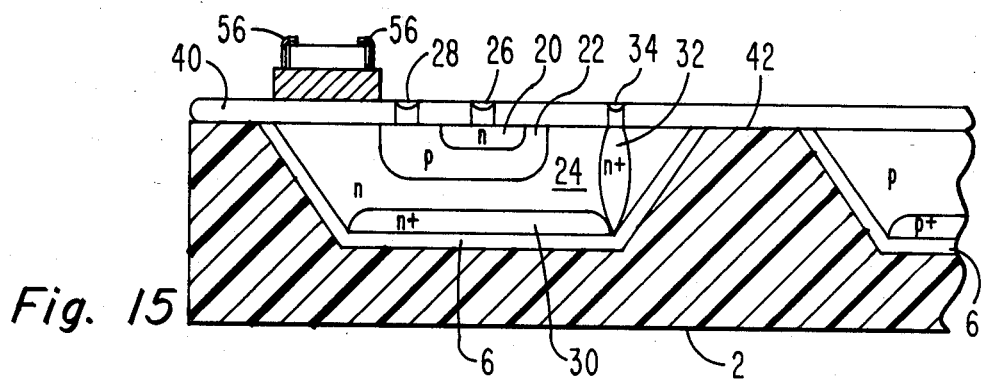
Figure 16:
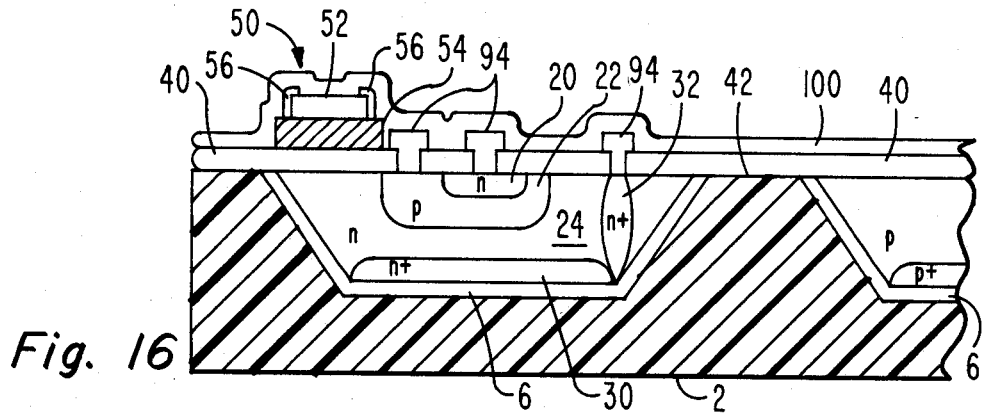

Referring to FIGS. 15 and 16 the well region shown in the preferred embodiment is an NPN transistor having an emitter 20, a base 22, and a collector 24. A pair of contacts 26 and 28 form electrical connections to the emitter 20 and base 22 respectively. A collector contact is made through a buried layer region 30, a deep collector diffusion 32, and a contact 34 on the surface of this integrated circuit. A layer of silicon dioxide 40 or some other suitable insulating material is arranged in intimate contact with the surface 42 of the substrate 2 and extends over the plurality of well regions 4 thereby completely covering the surface of the semiconductor device except for the contacts 26, 28, and 34. A fuse 50 is disposed on the layer of silicon dioxide 40 directly above the well region 4. The fuse 50 comprise a fuse element 52, a holder 54, and a pair of fuse contacts 56. As is best seen in FIG. 12a the fuse element 52 has a portion 53 of reduced cross section area which defines the current and time characteristics of fusing.

Figure 2:
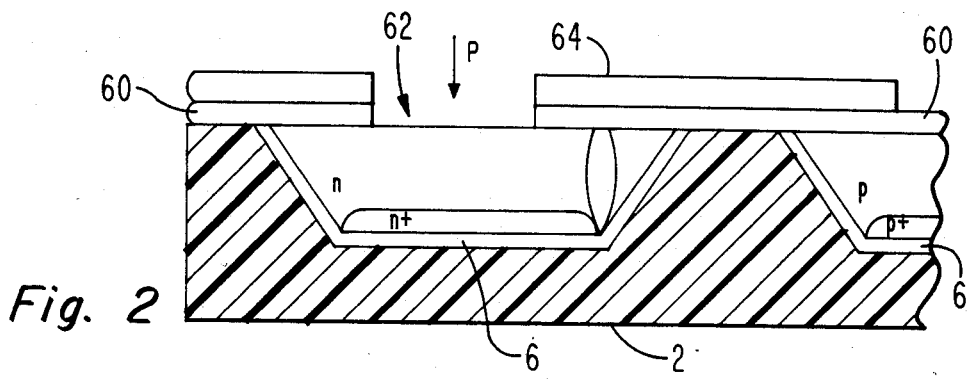
Figure 3:
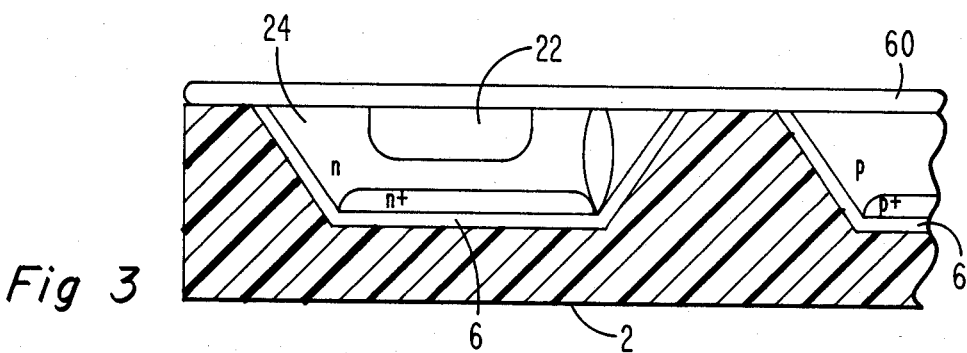
Figure 4:
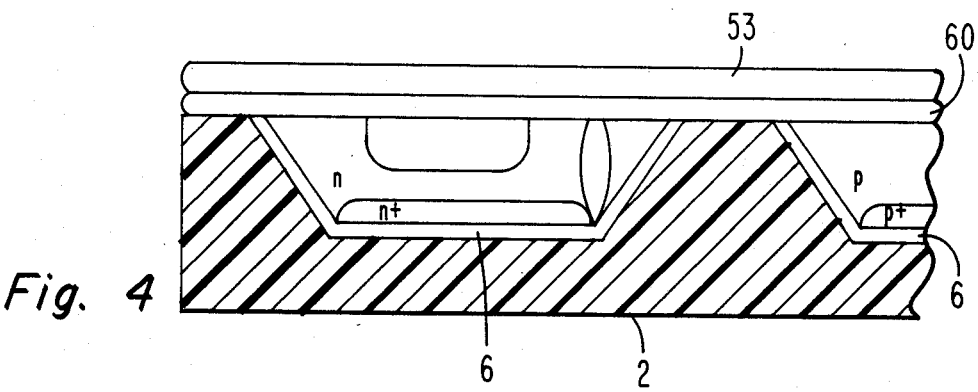
Figure 5:
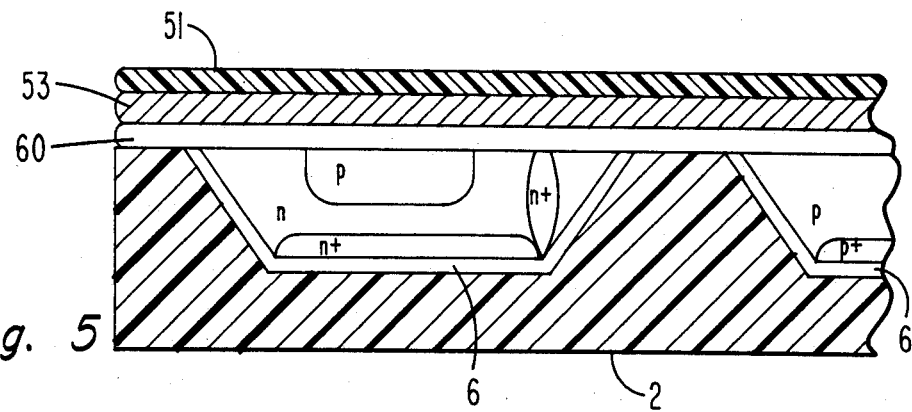
Figure 6:
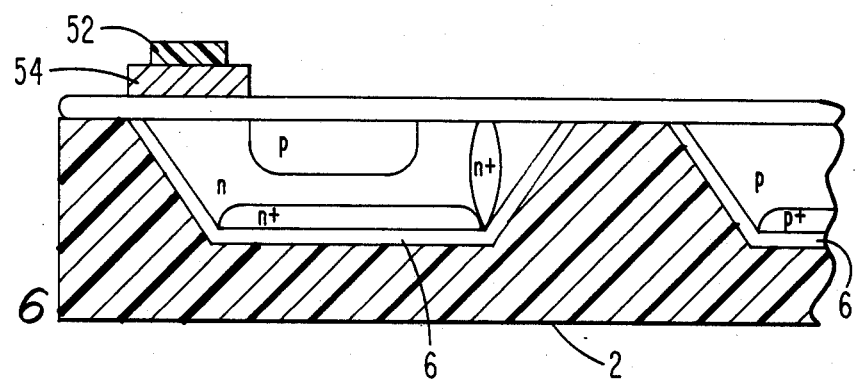

Turning now to the method of manufacturing the semiconductor device of the present invention, a relatively thick insulating layer 60, which may be silicon dioxide for example, is deposited; or otherwise formed on the surface 42 of the substrate 2. An opening 62 is then etched in this layer 60 through a suitable mask 64 as shown in FIG. 2. A base 22 is then diffused into the collector 24 through the opening 62, or implanted and then diffused, and the mask 64 removed. The diffusion process partially restores the layer of silicon dioxide 60 directly over the collector whereupon additional silicon dioxide is formed to completely restore the layer 60 as is shown in FIG. 3. A layer of silicon nitride 53 having a thickness of approximately 2000 angstroms is then deposited on the layer of silicon dioxide 60 followed by a layer of polycrystalline silicon (polysilicon) 51 having a thickness of approximately 1000 angstroms. This double layer of silicon nitride and polysilicon extends over the entire wafer and comprises the material from which the fuses 50 are made. A mask is positioned over the double layer and is arranged to define the fuse 52 as shown in FIG. 12a. Excess polysilicon is then etched away. A second mask is then utilized to define the fuse holder 54. The excess silicon nitride is then etched away leaving the fuse element 52 upon the rectangular holder 59, as shown in FIGS. 6 and 12a.

Figure 7:
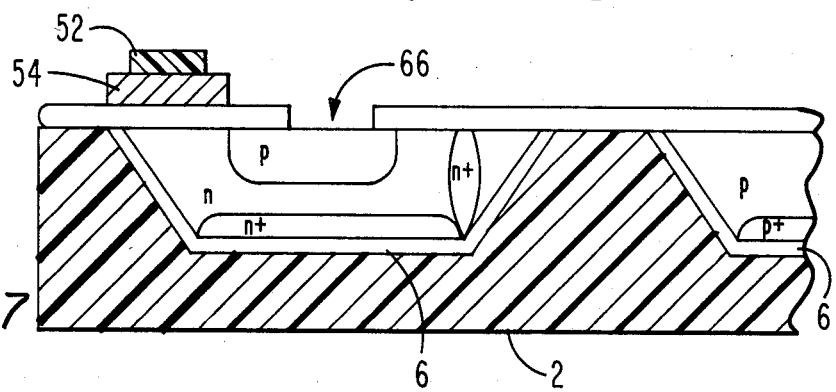
Figure 8:
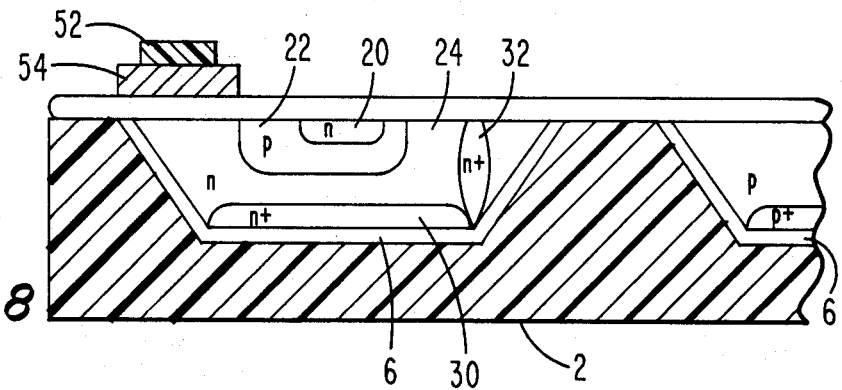
Figure 9:
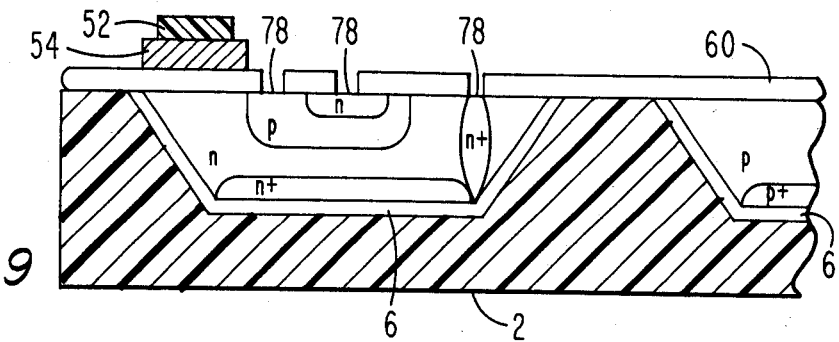
Figure 10:
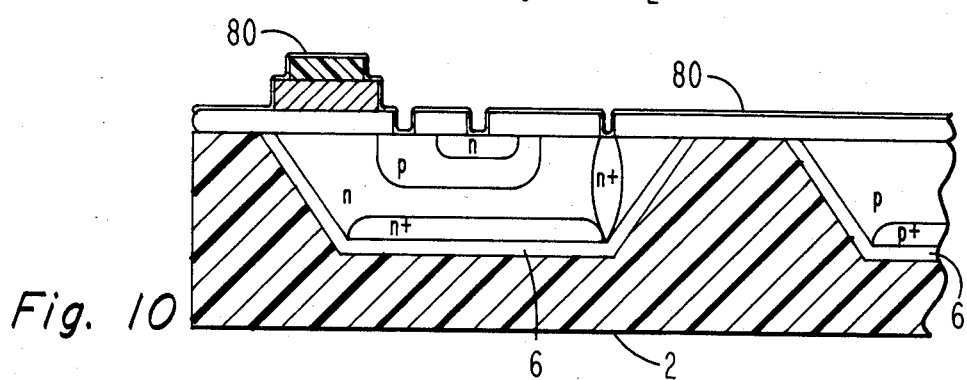
Figure 11:
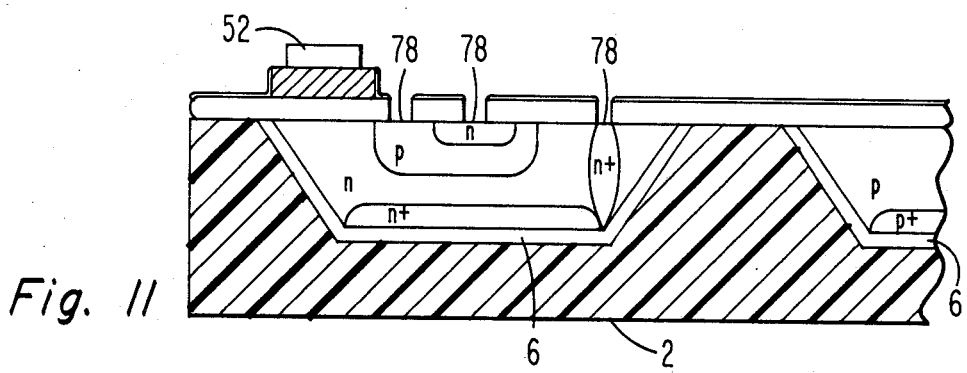

An opening 66 is then etched in the layer 60 through a suitable mask as shown in FIG. 7 and an emitter 20 is either diffused into the base 22 or implanted and then diffused. The diffusion process partially restores the layer of silicon dioxide 60 directly over the base whereupon additional silicon dioxide is formed to completely restore the layer 60 as shown in FIG. 8. A plurality of openings are then formed in the layer 60, one opening directly over each area of the well region where an electrical contact is to be established thereby defining contact areas 78. A layer 80 of platinum having a thickness of approximately 700 angstroms is then formed on the entire surface of the wafer including the fuse element and the contact areas 78, as shown in FIG. 10. The platinum layer 80 is formed by platinum sputtering techniques well known in the art. The wafer is then heated to a temperature of 650° C. for 13 minutes whereupon the platinum alloys with the fuse element 52 and the surfaces of the contact areas 78 forming platinum silicide. The residual platinum is then etched away from the wafer as shown in FIG. 12. A heavy layer 83 of silicon dioxide or similar protective coating is formed on the fuse 52 in the area indicated by the broken lines 84 shown in FIGS. 12a and 13. This layer 83 is used to protect the delicate fuse element 52 while forming electrical contacts at each end thereof.

A layer 90 of titanium having a thickness of approximately 2000 angstroms is formed on the entire surface of the semiconductor including the two ends or extremities of the fuse element 52 and the surfaces of the contact areas 78. A layer 92 of aluminum having a thickness of approximately 15,000 angstroms is then formed on the layer 90 of titanium. The layers of titanium and aluminum are formed in any conventional but suitable manner well known in the art such as sputtering or evaporation. The layers 90 and 92 of titanium and aluminum are then removed from all areas of the semiconductor except the two ends of the fuse element 52 not covered by the layer 83 of silicon dioxide and the contact areas 78. This procedure yields a pair of electrical contacts 56, one disposed at each extremity of the fuse element 52, and electrical contacts 26, 28, and 34 arranged on the surfaces of the emittor 20, base 22, and collector 24 respectively, as shown in FIG. 15. Finally, a protective passivation layer 100 of phosphorus silicate glass is applied to the entire surface of the wafer.

The method described herein pertains to the construction of a single NPN transistor with an integral fuse. As pointed out above, the starting wafer shown in FIG. 1 has a plurality of dielectrically isolated well regions, some of which are of n-type conductivity material and others are of p-type conductivity material. Therefore, a variety of individual elements such as transistors, diodes, et al, some containing fuses, may be concurrently constructed on the wafer. The individual elements may be electrically interconnected by metal conductors 94, as best seen in FIG. 16, thereby forming an integrated circuit device. The metal conductors may be formed by dual layer metallization techniques the methods of which are known by those skilled in the art, or any other suitable method.

I claim:

1. A method of forming a semiconductor device comprising the steps of:
   (a) forming a plurality of spaced apart first conductivity type regions in the surface of a substrate, each of said regions being dielectrically isolated from said substrate;
   (b) forming a base of second conductivity type within at least one of said plurality of regions;
   (c) forming a layer of silicon oxide on the surface of said at least one region;
   (d) forming a layer of silicon nitride on said layer of silicon oxide;
   (e) forming a layer of polycrystalline silicon on said layer of nitride;
   (f) removing a portion of said layers of nitride and polysilicon to define a fuse element of the remaining portion of said layers;
   (g) forming an emitter of first conductivity type within said base formed in step b;
   (h) forming a layer of silicon oxide upon said emitter;
   (i) forming a plurality of openings in said layer of silicon oxide; thereby exposing portions of said regions;
   (j) forming a layer of platinum upon said layer of silicon oxide, said exposed portions of said regions, and said fuse element;
   (k) heating said semiconductor and alloying said platinum and said remaining portion of polysilicon of said fuse element and said portions of said regions to form platinum silicide;
   (l) removing residual platinum from said semiconductor leaving said platinum silicide fuse element and said platinum silicide portions of said regions;
   (m) forming a plurality of electrical contacts, one at each of two extremities of said fuse element and one at each of said portions of said regions;
   (n) interconnecting said electrical contacts to form an integrated circuit.

2. The method is set forth in claim 1 wherein the base of step (b) and the emitter of step (g) are formed by implanting.

3. The method is set forth in claim 2 wherein the layers of silicon oxide of steps (c) and (h) are formed by diffusing said base and said emitter respectively.

4. The method is set forth in claim 3 wherein step (m) includes the steps of:
   (m1) forming a layer of titanium upon said semiconductor;
   (m2) forming a layer of aluminum upon said layer of titanium.
   (m3) removing said layers of titanium and aluminum formed in steps (m1) and (m2) from said semiconductor except from said two extremities of said fuse element and from each of said portions of said regions.

5. The method as set forth in claim 4 wherein step (m1) is preceded by a step of forming a layer of silicon dioxide on a portion of said fuse element.

6. The method as set forth in claim 5 wherein said interconnecting of electrical contacts in step n is effected by dual layer metallization techniques.

7. The method as set forth in claim 6 including a final step of passivating said semiconductor.

* * * * *